(12) United States Patent
Baskett

(10) Patent No.: US 7,218,174 B2
(45) Date of Patent: May 15, 2007

(54) DELAY CIRCUIT AND METHOD THEREFOR

(75) Inventor: Ira E. Baskett, Tempe, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 164 days.

(21) Appl. No.: 11/056,783

(22) Filed: Feb. 14, 2005

(65) Prior Publication Data

US 2006/0181347 A1 Aug. 17, 2006

(51) Int. Cl.
*H03F 3/45* (2006.01)
*H03F 3/68* (2006.01)
(52) U.S. Cl. ..................................... 330/252; 330/311
(58) Field of Classification Search .................. None
See application file for complete search history.

(56) References Cited

U.S. PATENT DOCUMENTS

| | | | | |
|---|---|---|---|---|
| 3,641,450 A | * | 2/1972 | Lunn | 330/254 |
| 5,304,869 A | * | 4/1994 | Greason | 326/66 |
| 5,440,271 A | * | 8/1995 | Laws | 330/252 |
| 6,104,232 A | * | 8/2000 | Filip | 327/513 |
| 6,157,256 A | * | 12/2000 | Ranmuthu | 330/252 |
| 6,831,524 B1 | * | 12/2004 | Krawczyk et al. | 331/57 |
| 7,071,858 B2 | * | 7/2006 | Pan | 341/133 |

FOREIGN PATENT DOCUMENTS

FR    2648968 A   * 12/1990

* cited by examiner

*Primary Examiner*—Robert Pascal
*Assistant Examiner*—Krista Flanagan
(74) *Attorney, Agent, or Firm*—Robert F. Hightower

(57) ABSTRACT

In one embodiment, a delay circuit is formed to use cascode coupled transistors to receive signals from a differential pair and increase the propagation through the delay circuit.

16 Claims, 3 Drawing Sheets

10

100

DELAY CIRCUIT AND METHOD THEREFOR

BACKGROUND OF THE INVENTION

The present invention relates, in general, to electronics, and more particularly, to methods of forming semiconductor devices and structure.

In the past, the semiconductor industry utilized various structures and methods to produce circuits that were used to provide incremental propagation delays within a circuit function. These circuits were used for various applications including to de-skew signals within clock distribution networks, in phase locked loop functions, and in various other applications. FIG. 1 schematically illustrates an example of a prior amplifier circuit 100 that was used to reduce the effect of internal capacitance and reduce delays of circuit 100. Circuit 100 includes differential coupled transistors 101 and 102 that were used as a differential amplifier. Transistors 107 and 108 were coupled to the emitters of respective transistors 103 and 104 to induce a small bias current through respective transistors 103 and 104 which limited the voltage swing at the collectors of transistors 101 and 102 and reduced the delay. One problem with this prior circuit was the power dissipation of circuit 100. The extra current induced by transistors 107 and 108 increased the power dissipation of the circuit. Additionally, a large output current typically was supplied by outputs 105 and 106 in order to drive the next stage connected to outputs 105 and 106.

Accordingly, it is desirable to have a delay circuit that has lower power dissipation and that utilizes less current.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain NPN or PNP devices, a person of ordinary skill in the art will appreciate that complementary devices are also possible in accordance with the present invention.

DETAILED DESCRIPTION OF THE DRAWINGS

Figure 1:
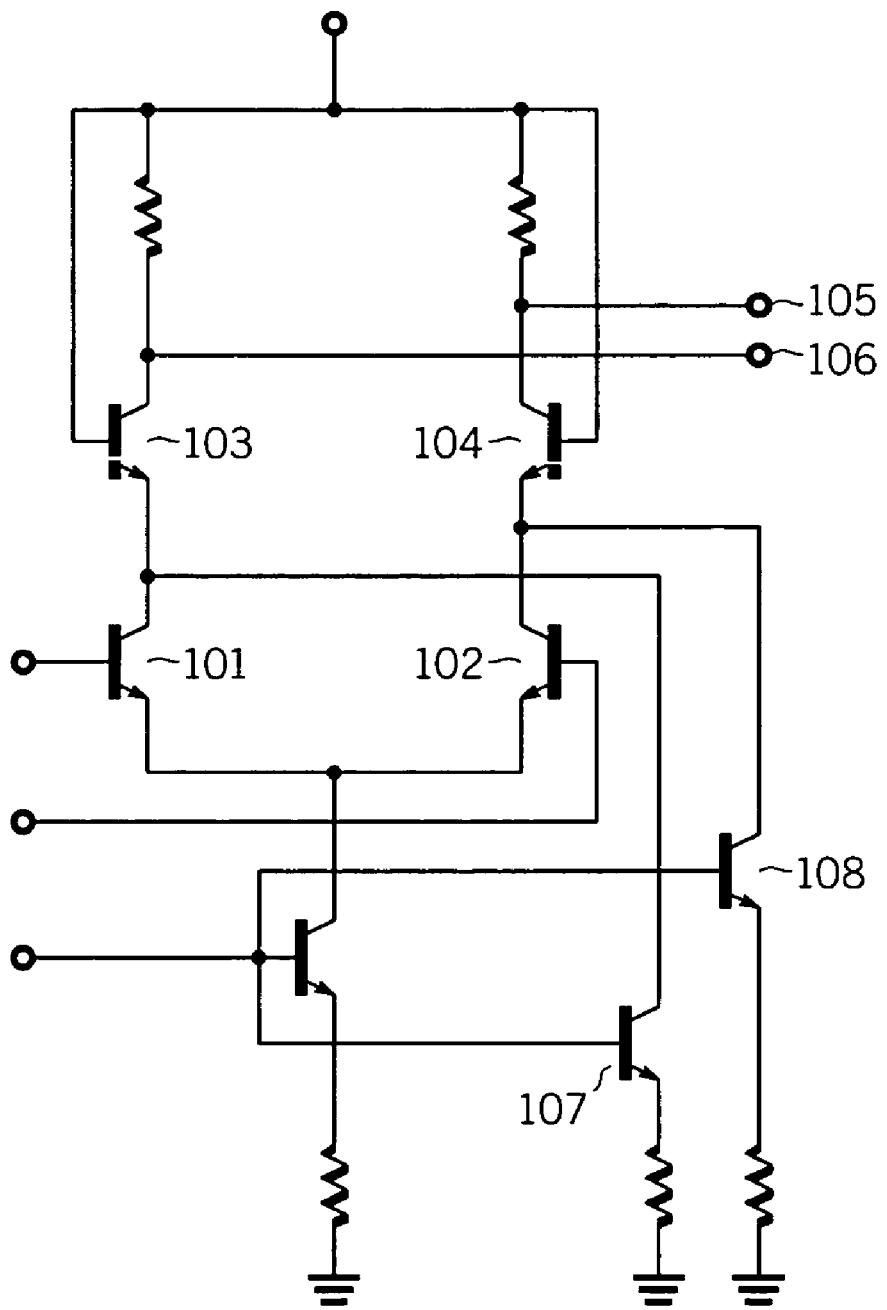
FIG. 1 schematically illustrates an example of a prior art circuit.
Figure 2:
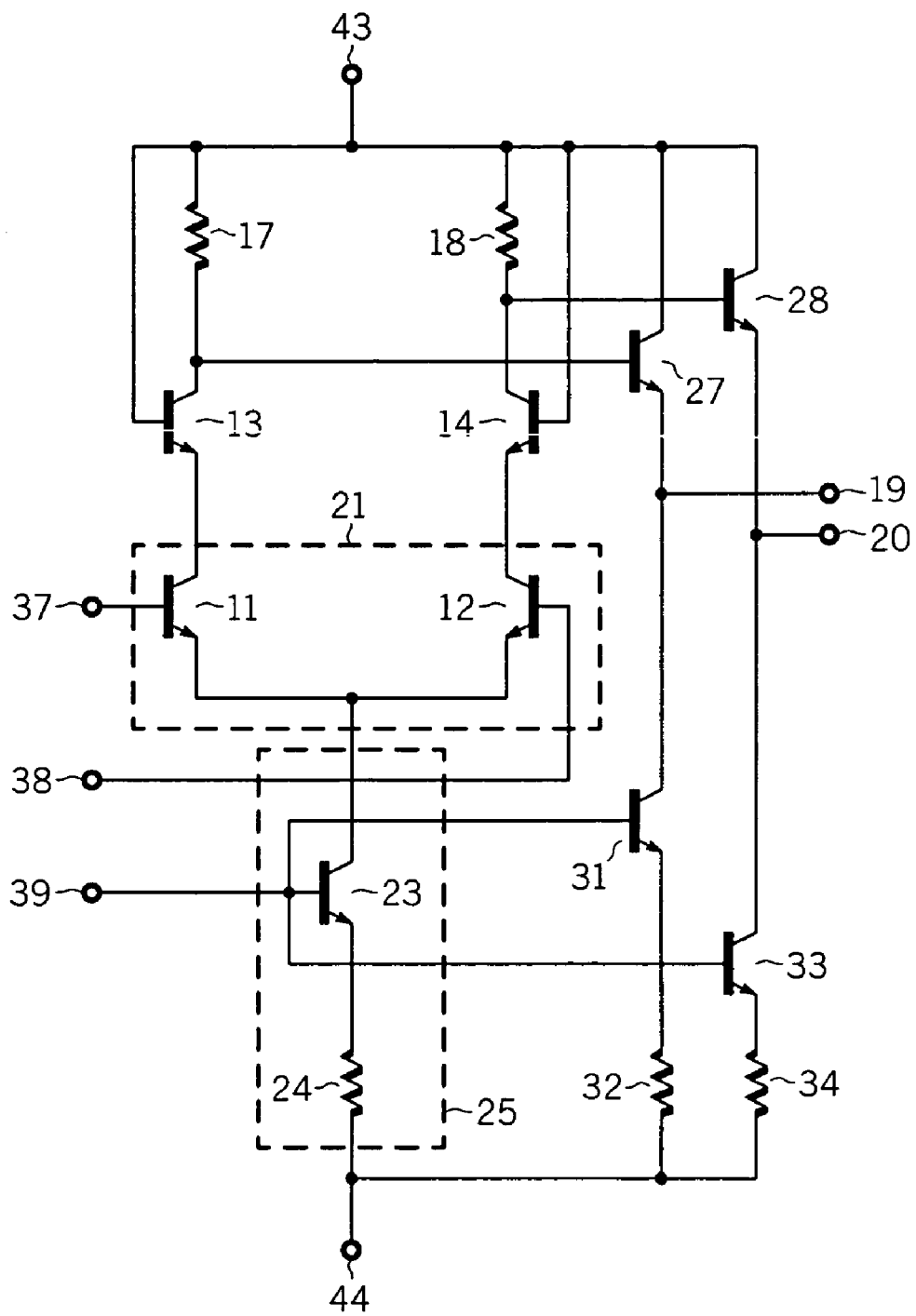
FIG. 2 schematically illustrates a portion of an embodiment of a delay circuit in accordance with the present invention.

FIG. 2 schematically illustrates a portion of an embodiment of a delay circuit 10 that provides increased delay between the input and output signals of circuit 10 and that has low power dissipation. Circuit 10 receives differential input signals between inputs 37 and 38, and provides differential output signals between outputs 19 and 20. Power is received between a voltage input 43 and a voltage return 44 of circuit 10. Circuit 10 includes a differential amplifier that has a first differential transistor 11 and a second differential transistor 12 coupled as a differential pair 21 of the differential amplifier. A biasing circuit 25 of circuit 10 provides a bias current to the differential amplifier. Circuit 25 includes a bias transistor 23 and a bias resistor 24. Circuit 10 also includes a first cascode transistor 13 and a second cascode transistor 14 that are coupled to receive signals from respective transistors 11 and 12, load resistors 17 and 18, emitter follower coupled transistors 27 and 28, bias transistors 31 and 33, and bias resistors 32 and 34. Transistor 31 and resistor 32 function as a bias circuit that sets a bias current flow through transistor 27. Transistor 33 and resistor 34 similarly function as a bias circuit to set the bias current flow through transistor 28.

In operation, if the signals received by transistors 11 and 12 apply a larger voltage to the base of transistor 11 than to the base of transistor 12, transistor 11 turns-on. Since the bases of transistors 13 and 14 are fixed, the voltage on the collector of transistor 11 has to decrease to a value that is sufficient to turn on transistor 13. Turning-on transistor 13 causes current flow through resistor 17 and a corresponding voltage drop across resistor 17. The emitter follower configuration of transistor 27 couples the value of the voltage on the collector of transistor 13, minus the base emitter voltage (Vbe) of transistor 27, to output 19. The extra amount of time required to enable transistor 13 increases the delay through circuit 10 without requiring extra current and the associated power dissipation. This can be viewed as adding another gate delay without using additional current. The emitter follower configuration of transistors 27 and 28 isolates outputs 19 and 20 from the load of successive circuits connected to outputs 19 and 20.

Similarly, if the signals received by transistors 11 and 12 apply a larger voltage to the base of transistor 12 than to the base of transistor 11, transistor 12 turns-on. Since the bases of transistors 13 and 14 are fixed, the voltage on the collector of transistor 12 has to decrease to a value that is sufficient to turn on transistor 14. Turning-on transistor 14 causes current flow through resistor 18. The emitter follower configuration of transistor 28 couples the value of the voltage on the collector of transistor 14, minus the base emitter voltage (Vbe) of transistor 28, to output 20. The extra amount of time required to enable transistor 14 increases the delay through circuit 10 without requiring extra current and the associated power dissipation. The emitter follower configuration of transistors 27 and 28 isolates outputs 19 and 20 from the load of successive circuits connected to outputs 19 and 20.

In order to implement this functionality of circuit 10, input 37 is connected to the base of transistor 11 and input 38 is connected to the base of transistor 12. An emitter of transistor 11 is commonly connected to an emitter of transistor 12 and a collector of transistor 23. The collector of transistor 11 is connected to an emitter of transistor 13. The collector of transistor 13 is commonly connected to a base of transistor 27 and to a first terminal of resistor 17. A second terminal of resistor 17 is commonly connected to input 43 and to a base of transistor 13. An emitter of transistor 14 is connected to a collector of transistor 12. A collector of transistor 14 is commonly connected to a base of transistor 28 and to a first terminal of resistor 18. The second terminal of resistor 18 is commonly connected to input 43 and to a base of transistor 14. A collector of transistor 27 is commonly connected to input 43 and a collector of transistor 28. An emitter of transistor 27 is commonly connected to output 19 and to the collector of transistor 31. An emitter of transistor 31 is connected to a first terminal of resistor 32 which has a second terminal commonly connected to return 44, a first terminal of resistor 24, and a first terminal of resistor 34. A second terminal of resistor 34 is connected to the emitter of transistor 33 which has a collector commonly connected to output 20 and an emitter of transistor 28. A bias control input 39 is commonly connected to a base of transistor 23, a base of transistor 31, and a base of transistor 33. An emitter of transistor 23 is connected to a second terminal of resistor 24.

Figure 3:
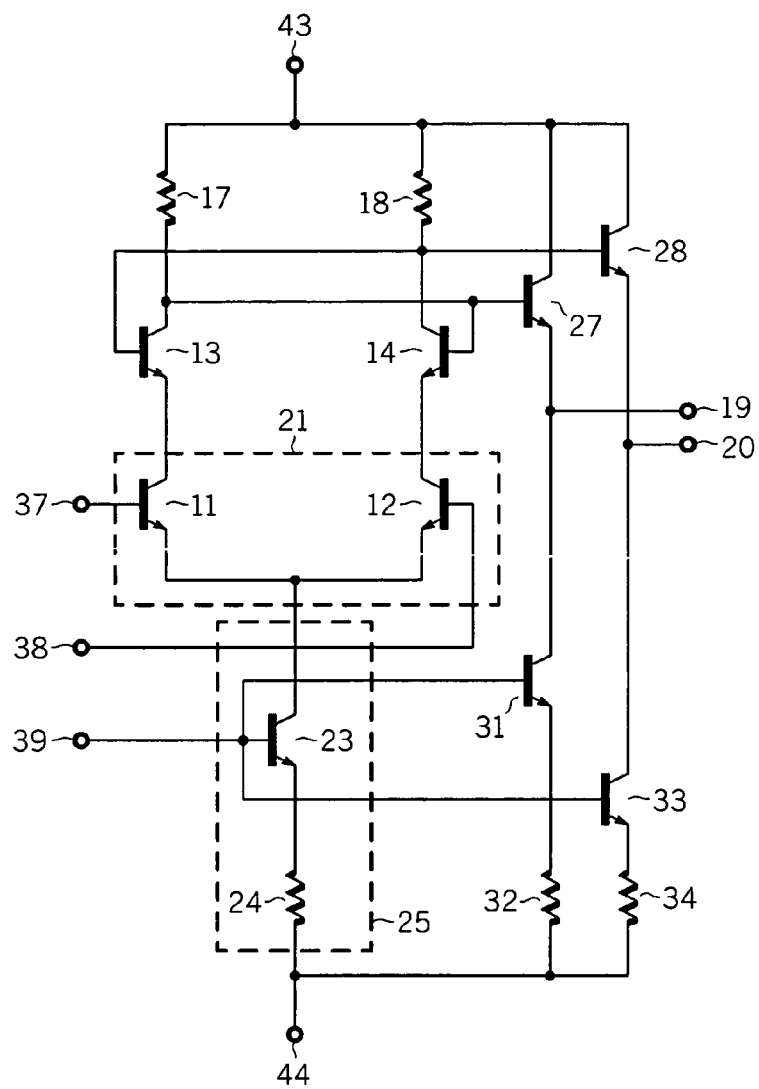
FIG. 3 schematically illustrates a portion of an alternate embodiment of the delay circuit of FIG. 2 in accordance with the present invention.

FIG. 3 schematically illustrates a portion of an embodiment of a delay circuit 50 that is an alternate embodiment of delay circuit 10 explained in the description of FIG. 2. Circuit 50 is similar to circuit 10 except that the base of each cascode transistor is also connected to the collector of the opposite cascode transistor. Similarly, the base of each of emitter follower transistors 27 and 28 is also connected to the base of the opposite cascode transistor. Thus, the base of transistor 14 is additionally connected to the collector of transistor 13 and the base of transistor 13 is also connected to the collector of transistor 14. In operation, as the collector of one of cascode transistors 13 or 14 decreases in voltage, the base of the opposite cascode transistor also decreases which increases the amount of time required to turn on the cascode transistor thereby increasing the delay of circuit 50. For example, if the signals received by transistors 11 and 12 apply a larger voltage to the base of transistor 11 than to the base of transistor 12, transistor 11 turns-on. However the collector of transistor 14, thus the base of transistor 13, is low since transistor 12 was previously conducting. Transistor 14 continues to be turned-on until the voltage on the collector of transistor 11 decreases to a value that is sufficient to turn on transistor 13. But the base of transistor 13 was low, thus the voltage on the collector of transistor 11 must go even lower to enable transistor 13. The low voltage on the base of transistor 13 requires extra time to enable transistor 13 thereby increasing the delay through circuit 50. Additionally, once transistor 13 is enabled, transistor 13 rapidly transitions thereby decreasing the rise and fall times of the edges of the output signals on outputs 19 and 20.

Similarly, if the signals received by transistors 11 and 12 apply a larger voltage to the base of transistor 12 than to the base of transistor 11, transistor 12 turns-on. However the collector of transistor 13, thus the base of transistor 14, is low since transistor 11 was previously conducting. Transistor 13 continues to be turned-on until the voltage on the collector of transistor 12 decreases to a value that is sufficient to turn on transistor 14. But since the base of transistor 14 was low, the voltage on the collector of transistor 12 must go even lower to enable transistor 14. The low voltage on the base of transistor 14 requires extra time to enable transistor 14 thereby increasing the delay through circuit 50. Additionally, once transistor 14 is enabled, transistor 14 rapidly transitions thereby decreasing the rise and fall times of the edges of the output signals on outputs 19 and 20.

Figure 4:
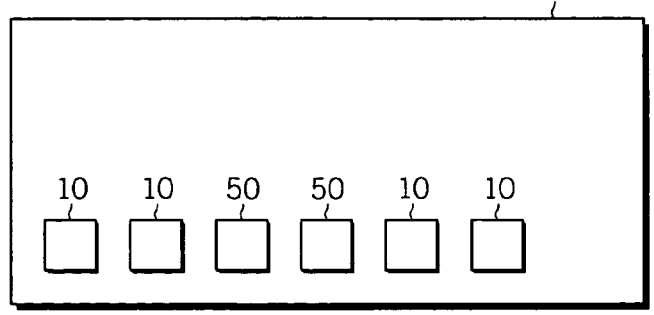
FIG. 4 schematically illustrates an enlarged plan view of a semiconductor device that includes the delay circuit of FIG. 1 or FIG. 2 in accordance with the present invention.

FIG. 4 schematically illustrates an enlarged plan view of a portion of an embodiment of a semiconductor device 60 that is formed on a semiconductor die 61. In some applications multiple circuits 10 or circuits 50 or combinations thereof may be used on a semiconductor die. Die 61 illustrates several circuits 10 and circuits 50 formed on die 61. Die 61 may also include other circuits that are not shown in FIG. 4 for simplicity of the drawing. Circuits 10 and 50 are formed on die 61 by semiconductor manufacturing techniques that are known to those skilled in the art.

In view of all of the above, it is evident that a novel device and method is disclosed. Included, among other features, is forming cascode transistors coupled to the differential pair transistors to receive signals from the differential pair. The cascode coupled transistors increase the delay time without increasing the power dissipation. Additionally, emitter follower transistors are coupled between the cascode transistors and the outputs of the delay circuit. The emitter follower configuration reduces the load on the cascode transistors and reduces skew between the signals on the outputs of the delay circuit.

While the invention is described with specific preferred embodiments, it is evident that many alternatives and variations will be apparent to those skilled in the semiconductor arts. Although delay circuits 10 and 50 are described for NPN bipolar transistors, the techniques are also applicable to PNP transistors and to MOS transistors. More specifically the invention has been described for a particular NPN transistor structure, although the method is directly applicable to other bipolar transistors, as well as to MOS, CMOS, BiCMOS, metal semiconductor FETS (MESFETS), HFETs, and other transistor structures. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A delay circuit comprising:
   first and second differential transistors coupled as a differential pair;
   a first cascode transistor coupled to receive a signal from the first differential transistor, the first cascode transistor having a first current carrying electrode, a second current carrying electrode, and a control electrode;
   a second cascode transistor coupled to receive a signal from the second differential transistor, the second cascode transistor having a first current carrying electrode coupled to the control electrode of the first cascode transistor, a control electrode coupled to the first current carrying electrode of the first cascode transistor, and a second current carrying electrode
   a first emitter follower transistor coupled to receive a signal from the first cascode transistor, the first emitter follower transistor having a first current carrying electrode and a second current carrying electrode; and
   a second emitter follower transistor coupled to receive a signal from the second cascode transistor, the second emitter follower transistor having a first current carrying electrode and a second current carrying electrode.

2. The delay circuit of claim 1 wherein the first emitter follower transistor includes the first emitter follower transistor having a base coupled to the first current carrying electrode of the first cascode transistor, and an emitter coupled to a first output of the delay circuit.

3. The delay circuit of claim 2 wherein the first cascade transistor includes the second current carrying electrode of the first cascode transistor coupled to the first current carrying electrode of the first differential transistor.

4. The delay circuit of claim 3 further including the second current carrying electrode of the first differential transistor is coupled to the first current carrying electrode of the second differential transistor.

5. The delay circuit of claim 2 wherein the second emitter follower transistor includes the second emitter follower transistor having a base coupled to the first current carrying electrode of the second cascode transistor, and an emitter coupled to a second output of the delay circuit.

6. The delay circuit of claim 5 wherein the second cascode transistor includes the second current carrying electrode of the second cascode transistor coupled to the first current carrying electrode of the second differential transistor.

7. The delay circuit of claim 1 further including a first load resistor coupled between the first cascode transistor and a power input of the delay circuit.

8. The delay circuit of claim 7 further including a second load resistor coupled between the second cascode transistor and the power input of the delay circuit.

9. A method of forming a delay circuit comprising:
forming a differential pair coupled to receive input signals;
configuring cascode coupled transistors to receive signals from the differential pair; and
configuring follower coupled transistors to receive signals from the cascode coupled transistors and form output signals representative of the input signals and delayed from the input signals including coupling a control electrode of a first follower transistor to a first current carrying electrode of a first cascode transistor, coupling a first current carrying electrode of the first follower transistor to a first output of the delay circuit, coupling a control electrode of a second follower transistor to a first current carrying electrode of a second cascode transistor, and coupling a first current carrying electrode of the second follower transistor to a second output of the delay circuit; and
coupling a first bias transistor to the first current carrying electrode of the first follower transistor and coupling a second bias transistor to the first current carrying electrode of the second follower transistor.

10. The method of claim 9 wherein configuring cascode coupled transistors to receive signals from the differential pair includes coupling the cascode coupled transistors in series between the differential pair and a power input to the delay circuit.

11. The method of claim 9 wherein configuring follower coupled transistors to receive signals from the cascode coupled transistors includes coupling The emitter follower coupled transistors to collectors of the cascode coupled transistors.

12. The method of claim 9 further including coupling a second current carrying electrode of the first cascode transistor to a first current carrying electrode of a first differential transistor of the differential pair and coupling a second current carrying electrode of the second cascode transistor to a first current carrying electrode of a second differential transistor of the differential pair.

13. The method of claim 12 further including coupling a second current carrying electrode of the first differential transistor to a second current carrying electrode of the second differential transistor.

14. The method of claim 13 further including coupling a bias circuit to the second current carrying electrode of the first differential transistor and to the second current carrying electrode of the second differential transistor.

15. The method of claim 9 further including coupling a control electrode of the first cascode transistor to the first current carrying electrode of the second cascode transistor and coupling a control electrode of the second cascode transistor to the first current carrying electrode of the second cascode transistor.

16. A method of forming a delay circuit comprising:
forming a differential pair coupled to receive input signals;
configuring cascode coupled transistors to receive signals from the differential pair;
configuring follower coupled transistors to receive signals from the cascode coupled transistors and form output signals representative of the input signals and delayed from the input signals; and
coupling a bias circuit in series with the differential pair to control current through the differential pair wherein the bias circuit is devoid of another differential pair.

* * * * *